United States Patent [19]

Mijuskovic

[11] Patent Number: 5,334,953
[45] Date of Patent: Aug. 2, 1994

[54] CHARGE PUMP BIAS CONTROL IN A PHASE LOCK LOOP

[75] Inventor: Dejan Mijuskovic, Chandler, Ariz.

[73] Assignee: Motorola, Inc., Schaumburg, Ill.

[21] Appl. No.: 94,738

[22] Filed: Jul. 22, 1993

[51] Int. Cl.$^5$ .................. H03L 7/089; H03L 7/093; H03L 7/10; H03L 7/18
[52] U.S. Cl. .................................... 331/8; 331/10; 331/15; 331/16; 331/17
[58] Field of Search ............. 331/17, 8, 10, 14, 15, 331/25, 16, 18; 455/165.1, 183.1, 192.2, 260

[56] References Cited

U.S. PATENT DOCUMENTS 5,144,156  9/1992  Kawasaki ......................... 331/17 X
5,166,641 11/1992  Davis et al. ........................ 331/17 X

*Primary Examiner*—David Mis
*Attorney, Agent, or Firm*—Robert D. Atkins

[57] ABSTRACT

A phase lock loop (PLL) is configured as a frequency synthesizer with a first programmable frequency divider placed in the input signal path and a second programmable frequency divider located between the output of an current controlled oscillator (ICO) and the second input of a phase detector. A charge pump receives control pulses from the phase detector to generate first and second currents to control the ICO. The control currents are low-pass filtered and summed before application to the ICO. To improve loop stability, the summation current to the ICO is duplicated and used to control the bias on the charge pump. With proper biasing, first and second control currents become dependent on the second programmable divider ratio and maintain the unity gain bandwidth of the loop constant at a value much less than the digital sampling rate.

3 Claims, 2 Drawing Sheets

CHARGE PUMP BIAS CONTROL IN A PHASE LOCK LOOP

BACKGROUND OF THE INVENTION

The present invention relates in general to phase lock loops and, more particularly, to charge pump bias control in a phase lock loop.

Phase lock loops (PLLs) are widely used for frequency synthesis. A conventional PLL may include a phase detector for monitoring a phase difference between an input signal and an output signal of a current controlled oscillator (ICO). The phase detector generates an up control signal and a down control signal for a charge pump to source and sink current through a low-pass loop filter to the input of the ICO. The positive and negative current pulses flowing from the charge pump into the ICO determine its output frequency. The up and down control signals driving the charge pump set the proper current levels into the ICO to maintain a predetermined phase relationship between the signals applied to the phase detector.

In the PLL frequency synthesizer application, a first programmable frequency divider is typically placed in the input signal path while a second programmable frequency divider is located between the output of the ICO and the second input of the phase detector. The output frequency of the PLL is given by input signal frequency times the ratio of the second frequency divider to the first frequency divider.

The PLL often includes both analog and digital processing. The phase detector and programmable frequency dividers are typically digital while the charge pump, low-pass loop filter and ICO operate analog. The lock status of the PLL is discretely sampled at the active edges of the input signals to the phase detector. The sampling rate is determined by the input signal frequency divided by the first programmable frequency divider. In order to suppress the noise in the system, the PLL bandwidth needs to be as large as possible. However, to maintain stable operation, the unity gain bandwidth of the PLL must be much less than digital sampling frequency. To properly control the sample rate, prior art PLL synthesizers have employed digital-to-analog converters (DAC) controlled by the first and second frequency divider ratios to perform the necessary tracking. Unfortunately, the use of DACs increase the chip area and cost of manufacturing and contribute to system noise.

Hence, a need exists for a PLL frequency synthesizer operating with a unity gain bandwidth smaller than the digital sampling frequency by a constant factor.

SUMMARY OF THE INVENTION

Briefly stated, the invention comprises a charge pump having first and second inputs receiving first and second control pulses, and first and second outputs for providing first and second control currents. A first circuit low-pass filters and sums the first and second control currents into a summation control current. A current controlled oscillator (ICO) has an input receiving the summation control current for setting frequency of operation of an oscillator signal. A second circuit is responsive to an output signal of the first circuit for duplicating the summation control current and providing a proportional bias signal to a control input of the charge pump.

DETAILED DESCRIPTION OF THE PREFERRED EMBODIMENT

Figure 1:
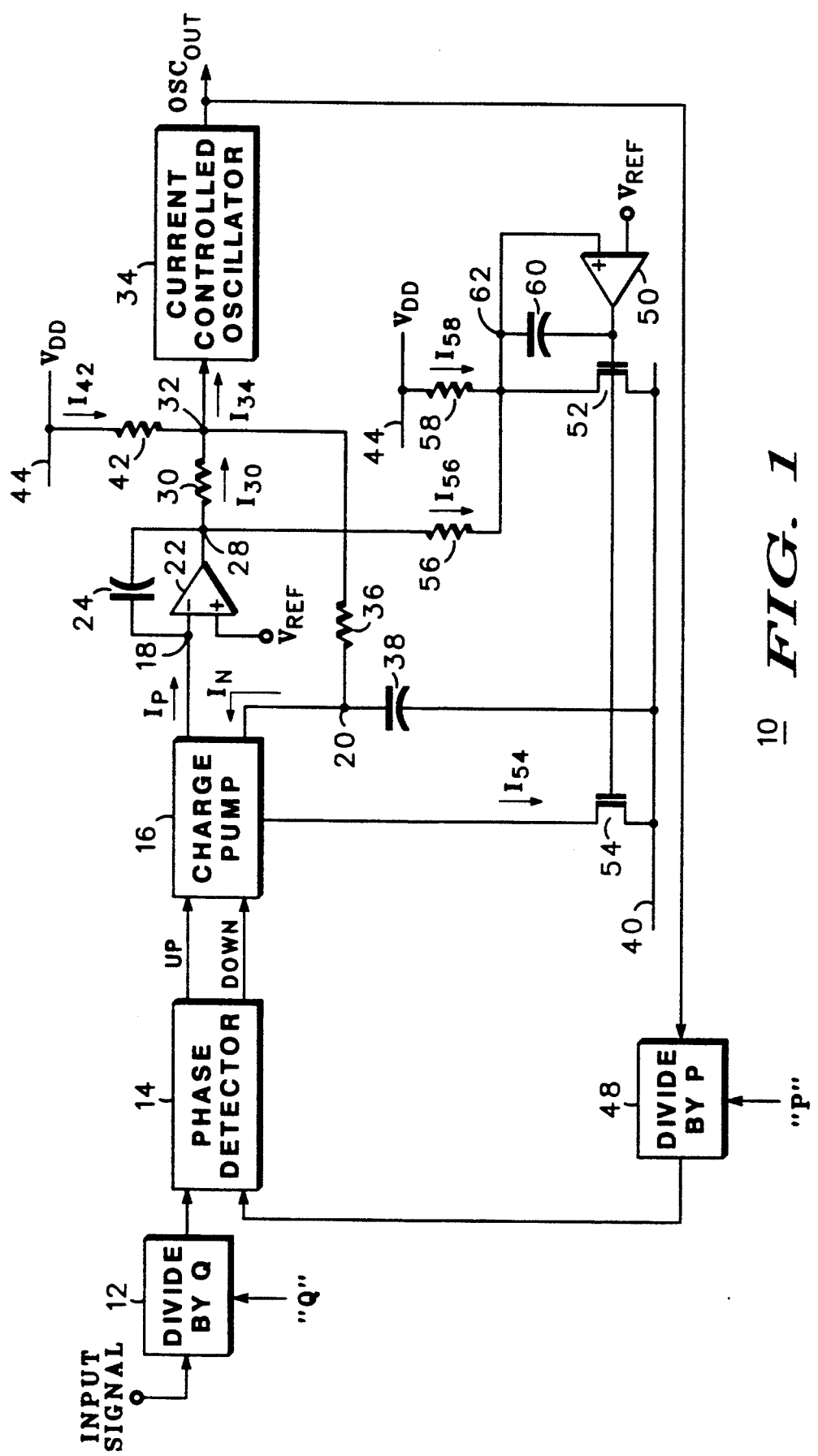
FIG. 1 is a block diagram illustrating a phase lock loop.

A digital phase lock loop (PLL) 10 is shown in FIG. 1 suitable for manufacturing an integrated circuit using conventional integrated circuit processes. A digital input signal $V_{IN}$ having a frequency of say $F_{IN}=16$ MHz is applied to an input of divide-by-Q circuit 12. An integer value Q supplied externally controls the frequency division of divide-by-Q circuit 12 for providing an output signal having a frequency of $F_{IN}/Q$ to a first input of phase detector 14. The UP and DOWN outputs of phase detector 14 control charge pump 16 which in turn supplies a positive current $I_P$ into node 18 and a negative current $I_N$ into node 20. Currents $I_P$ and $I_N$ are the inverse of one anther, i.e. $I_P = -I_N$. Operational amplifier (op amp) 22 operates as an integrator with an inverting input coupled to node 18 and a non-inverting input receiving reference voltage $V_{REF}$ operating at 2.5 volts. Capacitor 24 is coupled between node 28 at the output of op amp 22 and node 18. A resistor 30 is coupled between node 28 and node 32 at the input of current controlled oscillator (ICO) 34, while a resistor 36 is coupled between node 20 and node 32. Capacitor 38 is coupled between node 20 and power supply conductor 40 operating at ground potential. Capacitor 24 in combination with resistor 30, and capacitor 38 in combination with resistor 36 and op amp 22, provide low-pass loop filtering for the control currents $I_P$ and $I_N$. Resistor 42 is coupled between node 32 and power supply conductor 44 operating at a positive potential such as $V_{DD}=5.0$ volts. The output signal OSCOUT of ICO 34 having a frequency of say $F_{OUT}=64$ MHz is applied to an input of divide-by-P circuit 48. An integer value P supplied externally controls the frequency division of divide-by-P circuit 48 for providing a feedback signal having a frequency of $F_{OUT}/P$ to a second input of phase detector 14.

In the present embodiment PLL 10 operates as a frequency synthesizer with the frequency of OSCOUT given by $F_{OUT}=F_{IN}*P/Q$. The integers P and Q may be selected for example at 64 and 16, respectively, to give the OSCOUT frequency of 64 MHz. Phase detector 14 performs a phase comparison between the $F_{IN}/Q$ signal and $F_{OUT}/P$ signal and generates UP and DOWN pulses accordingly. A logic one UP pulse applied to charge pump 16 sources control current $I_P$ into node 18 and sinks control current $I_N$ from node 20. A logic one DOWN pulse reverses the current flows such that $-I_P$ sinks current from node 18 while $-I_N$ sources current into node 20. Current $I_P$ flows into node 18 to develop a voltage across capacitor 24 and establish a variable DC output voltage at node 28 dependent on the current $I_P$. Resistor 30 converts the DC voltage into a current $I_{30}$ to control frequency variation of ICO 34. A fixed DC current $I_{42}$ flows from power supply conductor 44 through resistor 42 into ICO 34 to establish its nominal center operating frequency. Thus, current $I_{30}$ functions to vary the ICO output frequency about that nominal operating point. Control current $I_N$ flowing into node 32 maintains stable loop operation. The total control current $I_{34}$ flowing into ICO 34 is given as $I_{34} = I_{30} + I_{42} + I_N$.

If the $F_{IN}/Q$ signal leads the $F_{OUT}/Q$ signal, then phase detector 14 generates an UP pulse for charge pump 16 to source corrective current $I_P$ into node 18 and sink current $I_N$ from node 20. The DC voltage at node 28 and current $I_{30}$ increase to achieve a greater ICO output frequency and bring the $F_{OUT}/P$ signal in phase alignment with the $F_{IN}/Q$ signal. Conversely, if the $F_{IN}/Q$ signal lags the $F_{OUT}/P$ signal, then phase detector 14 generates a DOWN pulse for charge pump 16 to sink corrective current $-I_P$ from node 18 and source current $-I_N$ into node 20. The DC voltage at node 28 and current $I_{30}$ decrease resulting in a lower ICO output frequency to bring the $F_{OUT}/P$ signal in phase alignment with the $F_{IN}/Q$ signal. The pulse width of the UP and DOWN control signals determines the duration of control currents $I_P$ and $I_N$. The greater the phase difference between the $F_{IN}/Q$ signal and the $F_{OUT}/P$ signal, the greater the pulse width of the UP or DOWN control signal and the longer the currents $I_P$ and $I_N$ from charge pump 16 work to drive the ICO output frequency to minimize the phase difference at the inputs of phase detector 14.

When PLL 10 achieves phase lock, no UP or DOWN pulses are generated and node 28 maintains a relatively constant DC voltage commensurate with the $F_{IN}/Q$ signal. Substantially no filtered current flows through resistor 36. With the input signals to phase detector 14 equal in phase, $F_{IN}/Q = F_{OUT}/P$, or equivalently, $F_{OUT} = F_{IN} * P/Q$. By selecting the integers P and Q, PLL 10 may synthesize a desired output frequency $F_{OUT}$. Note that the DC voltage at node 28 decays over time, hence, occasional UP or DOWN pulses are needed to compensate for leakage and maintain the proper operating frequency for ICO 34.

PLL 10 operates as a mixed signal loop with part digital processing, i.e. phase detector 14 and divider circuits 12 and 48, and part analog processing, i.e. charge pump 16, integrating op amp 22 and ICO 34. The lock status of PLL 10 is discretely sampled at the active edges of $F_{IN}/Q$ and $F_{OUT}/P$ signals by phase detector 14. The sampling rate is thus $F_{IN}/Q$. To maintain stability, the unity gain bandwidth $F_K$ of PLL 10 must be much less than digital sampling frequency $F_{IN}/Q$. On the other hand, the PLL bandwidth needs to be as large as possible in order to suppress system noise. For optimal noise immunity, a ratio of 20 is selected to make $F_K = F_{IN}/(20*Q)$. The actual unity gain bandwidth $F_K'$ is given by equation (1):

$$F_K' = \frac{1}{2\pi} \cdot \frac{K_I \cdot I_N}{2\pi \cdot P} \quad (1)$$

where $K_I$ is the gain of ICO 34 (change in output frequency versus change in input control current) given in equation (2) as:

$$K_I = \frac{d(2\pi \cdot F_{OUT})}{dI_{34}} \quad (2)$$

For linear operation of ICO 34:

$$K_I \approx \frac{2\pi \cdot F_{OUT}}{I_{34}} \quad (3)$$

Notice from equation (1) that the actual unity gain bandwidth $F_K'$ is dependent on P although the desired unity gain bandwidth $F_K$ should be a function of Q, i.e. $F_K = F_{IN}/(20*Q)$. The desired result of making the actual unity gain bandwidth $F_K'$ a function of Q may be achieved by introducing a multiplication factor of P/Q into equation (1). This is achieved by making current $I_N$ proportional to P/Q. Since the output frequency $F_{OUT}$ is proportional to P/Q, the control current $I_{34}$ to ICO 34 must also be proportional to P/Q while in lock as shown by equation (4).

$$I_{34} = I_{30} + I_{42} + I_N = \frac{2\pi \cdot F_{OUT}}{K_I} = \frac{2\pi}{K_I} \cdot \frac{P}{Q} \cdot F_{IN} \quad (4)$$

As part of the present invention, the dependence of current $I_{34}$ on P/Q can be duplicated and used to control the bias of charge pump 16, thereby making current $I_N$ a function of P/Q. Substituting current $I_N$ as a function of P/Q into equation (1) would cancel its dependence on P and leave the desired result of a dependence on 1/Q.

Accordingly, operational amplifier 50 receives the reference voltage $V_{REF}$ at its inverting input and provides an output signal to the gates of transistors 52 and 54. The drain of transistor 52 is coupled through resistor 56 to node 28 and through resistor 58 to power supply conductor 44. The sources of transistors 52 and 54 are coupled to power supply conductor 40. Capacitor 60 is coupled between the output of operational amplifier 50 and its non-inverting input at node 62 for stability compensation. The output signal of op amp 50 controls the gate of transistor 52 to sink currents from resistors 56 and 58 and hold node 62 at the same voltage as node 32. Thus, the current $I_{56}$ flowing through resistor 56 is made equal to current $I_{30}$ flowing through resistor 30 because node 62 is held to the same potential as node 32 by op amp 50 and transistor 52. Likewise, the current $I_{58}$ through resistor 58 is equal to the current $I_{42}$ following through resistor 42. Transistor 52 conducts a current equal to currents $I_{30} + I_{42}$. Components 50–60 have thus duplicated the control current to ICO 34 in transistor 52. Transistor 54 receives the same gate drive and therefore conducts the same or proportional current as transistor 52. The drain of transistor 54 is coupled to a bias control input of charge pump 16 whereby it receives a bias control signal proportional to P/Q. The bias control determines the output control currents $I_P$ and $I_N$.

Figure 2:
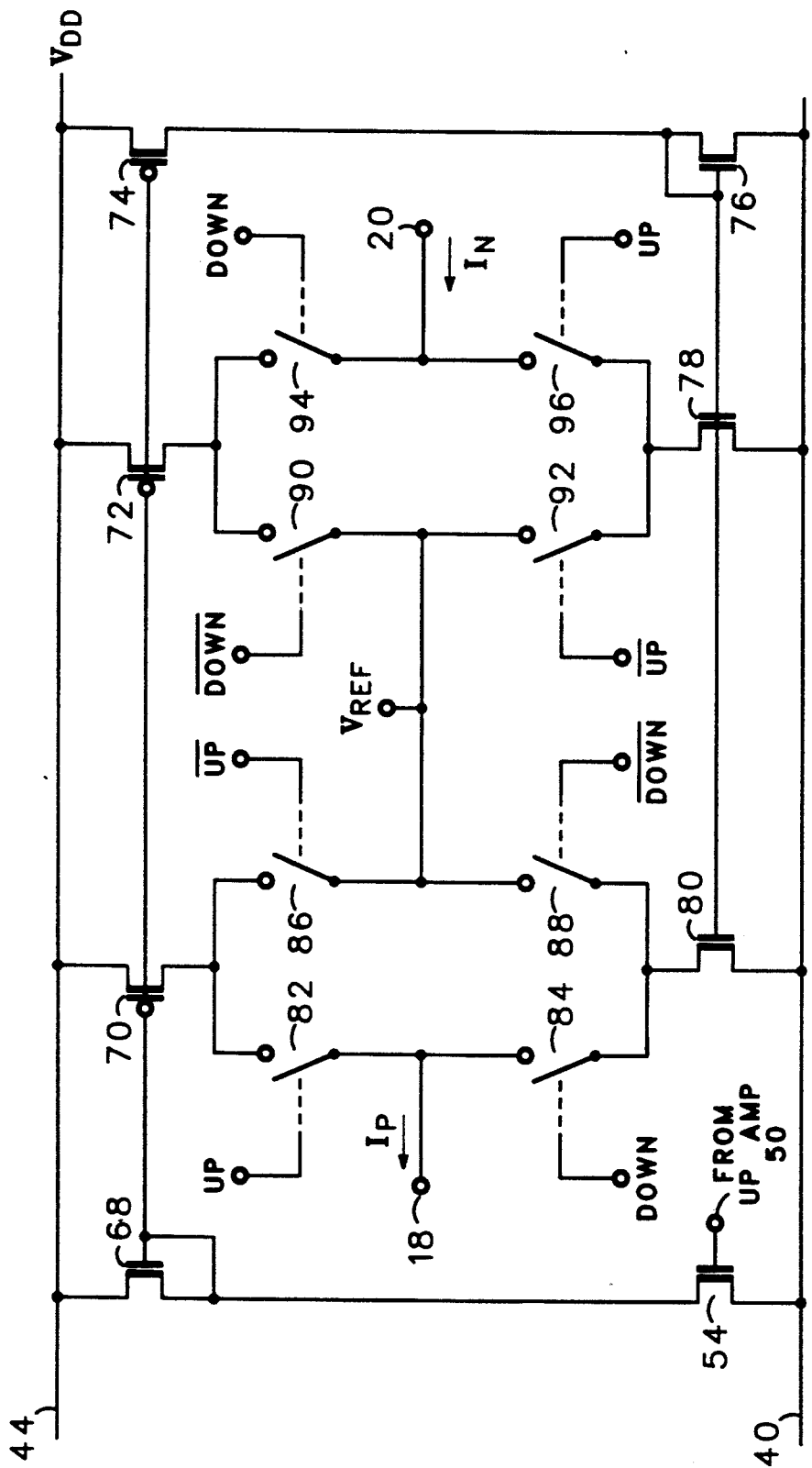
FIG. 2 is a schematic diagram illustrating the charge pump of FIG. 1.

Turning to FIG. 2, further detail of charge pump 16 is shown including transistor 68 having a gate and drain coupled together to the drain of transistor 54 taken from FIG. 1. Components having the same reference number used in FIG. 1 perform a similar function. The gate of transistor 68 is also coupled to the gates of transistors 70, 72 and 74 in a current mirror arrangement. The sources of transistors 68–74 are coupled to power supply conductor 44. The drain of transistor 74 is coupled to the gate and drain of transistor 76. The gate of transistor 76 is coupled to the gates of transistors 78 and 80 in a current mirror arrangement. The sources of transistors 76–80 are coupled to power supply conductor 40. Switching circuits 82 and 84 are serially coupled between the drain of transistor 70 and the drain of transistor 80. Switching circuits 86 and 88 are also serially coupled between the drain of transistor 70 and the drain of transistor 80. The interconnection of switching circuits 82 and 84 provides the first output of charge pump 16 for sourcing and sinking current $I_P$. The interconnection of switching circuits 86 and 88 receive reference voltage $V_{REF}$. Similarly, switching circuits 90 and 92 are serially coupled between the drain of transistor 72 and the drain of transistor 78. The interconnection of switching circuits 90 and 92 receiving reference voltage $V_{REF}$. Switching circuits 94 and 96 are serially coupled between the drain of transistor 72 and the drain of transistor 78. The interconnection of switching circuits 94 and 96 provides the second output of charge pump 16 for sinking and sourcing current $I_N$. Switching circuits 82-96 may each comprise a transistor operating in response to the UP and DOWN control pulses and their inverses as shown.

Again, transistor 54 shown in FIGS. 1 and 2 operates proportional to transistor 52 with dependence on P/Q and provides bias control for charge pump 16. The current $I_{56}$ flowing through transistor 54 also flows through current mirror transistor 68 and sets the gate potential for transistors 70-74 to conduct equal currents. Current mirror transistor 76 sets up similar currents in transistors 78 and 80. Thus, current source transistors 70, 72, 78 and 80 are each dependent on P/Q.

When UP is high and $\overline{UP}$ is low, switching circuit 86 is open and switching circuit 82 sources current $I_P$ from current source transistor 70 into node 18. DOWN is low and $\overline{DOWN}$ is high causing switching circuit 84 to open and switching circuit 88 to close completing a path between $V_{REF}$ and current source transistor 80. On the other side when UP is high and $\overline{UP}$ is low, switching circuit 92 opens and switching circuit 96 closes to sink current $I_N$ from node 20 into current source transistor 78. DOWN is low and $\overline{DOWN}$ is high causing switching circuit 94 to open and switching circuit 90 to close completing a path between $V_{REF}$ and current source transistor 72.

Conversely, when DOWN is high and $\overline{DOWN}$ is low, switching circuit 88 is open and switching circuit 84 sinks current $I_P$ from node 18 through current source transistor 80. UP is low and $\overline{UP}$ is high causing switching circuit 86 to open and switching circuit 82 to close completing a path between $V_{REF}$ and current source transistor 70. On the other side, DOWN is still high and $\overline{DOWN}$ is low whereby switching circuit 90 opens and switching circuit 94 closes to source current $I_N$ from current source transistor 72 into node 20. UP is low and $\overline{UP}$ is high causing switching circuit 96 to open and switching circuit 92 to close completing a path between $V_{REF}$ and current source transistor 78. With current source transistors 70, 72, 78 and 80 dependent on P/Q, current $I_N$ can now be defined by:

$$I_N = A \cdot \frac{2\pi}{K_I} \cdot \frac{P}{Q} \cdot F_{IN} \qquad (5)$$

where A is the proportionality factor between transistors 52 and 54. Substituting equation (5) into equation (1) yields:

$$F_K' = \frac{1}{2\pi} \cdot \frac{K_I}{2\pi \cdot P} \cdot A \cdot \frac{2\pi}{K_I} \cdot \frac{P}{Q} \cdot F_{IN} \qquad (6)$$

$$F_K' = \frac{A}{2\pi} \cdot \frac{F_{IN}}{Q} \qquad (7)$$

Notice that equation (7) is a function of 1/Q as desired and gain factor $K_I$ is eliminated. Selecting $$A = \frac{2\pi}{20}$$

reduces equation (7) to:

$$F_K' = \frac{F_{IN}}{20Q} \qquad (8)$$

which achieves the desired result of making the unity gain bandwidth of PLL 10 much less than digital sampling frequency $F_{IN}/Q$. The unity gain bandwidth is now a function of 1/Q in accordance with the digital sampling rate. Thus, a principal advantage of the present invention is use a known dependence of $I_{34}$ on the ratio P/Q, duplicate that dependence, and control the bias on charge pump 16 to eliminate any dependence on P. The result is increased stability and improved noise immunity for PLL 10.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   a charge pump having first and second inputs, first and second outputs and a bias control input, said first and second inputs being coupled for receiving first and second control pulses, said first and second outputs being coupled for providing first and second control currents;
   a first amplifier having first and second inputs and an output, said first input being coupled to said first output of said charge pump, said second input being coupled for receiving a reference voltage;
   a first capacitor coupled between said input of said first amplifier and said first input of said first amplifier;
   a first resistor coupled between said output of said first amplifier and a first node for providing a first summation current;
   a second resistor coupled between a first power supply conductor and said first node for providing said first summation current;
   a current controlled oscillator (ICO) having an input coupled for receiving said first summation control current from said first node for setting frequency of operation of an oscillator signal;
   a second amplifier having first and second inputs and an output, said first input being coupled for receiving said reference voltage;
   a second capacitor coupled between said output of said second amplifier and said second input of said second amplifier at a second node;
   a third resistor coupled between said second node and said first power supply conductor;
   a fourth resistor coupled between said second node and said output of said first amplifier;
   a first transistor having a gate, a drain and a source, said gate being coupled to said output of said second amplifier, said source being coupled to a second power supply conductor, said drain being coupled to said second node; and a second transistor having a gate, a drain and a source, said gate being coupled to said output of said second amplifier, said source being coupled to said second power supply conductor, said drain being coupled to said bias control input of said charge pump.

2. The circuit of claim 1 further including:

a first divider circuit having an input coupled for receiving an input signal, a control input coupled for receiving a first divider control signal and an output;

a phase detector having first and second inputs and first and second outputs, said first input being coupled to said output of said first divider circuit, said first and second outputs being coupled for providing said first and second control pulses; and a second divider circuit having an input coupled for receiving said oscillator signal, a control input coupled for receiving a second divider control signal and an output coupled to said second input of said phase detector.

3. The circuit of claim 2 further including:

a second capacitor coupled between said second output of said charge pump and said second power supply conductor; and a fifth resistor coupled between said second output of said charge pump and said input of said ICO.

* * * * *

UNITED STATES PATENT AND TRADEMARK OFFICE
CERTIFICATE OF CORRECTION

PATENT NO. : 5,334,953
DATED : August 2, 1994
INVENTOR(S) : Dejan Mijuskovic

It is certified that error appears in the above-indentified patent and that said Letters Patent is hereby corrected as shown below:

In column 6, line 40, claim 1, delete "input" and insert therefor --output--.

Signed and Sealed this

Twenty-first Day of November, 1995

Attest:

BRUCE LEHMAN

Attesting Officer

Commissioner of Patents and Trademarks